(12) United States Patent
Chu et al.

(10) Patent No.: US 10,454,436 B2
(45) Date of Patent: Oct. 22, 2019

(54) WIRELESS TRANSCEIVER

(71) Applicant: National Chiao Tung University, Hsinchu (TW)

(72) Inventors: Ta-Shun Chu, Taipei (TW); Yu-Jiu Wang, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/183,849

(22) Filed: Nov. 8, 2018

(65) Prior Publication Data

US 2019/0245587 A1 Aug. 8, 2019

(30) Foreign Application Priority Data

Feb. 2, 2018 (TW) .............................. 107103738 A

(51) Int. Cl.
*H03F 3/62* (2006.01)
*H03H 11/34* (2006.01)
(Continued)

(52) U.S. Cl.
CPC ................. *H03F 3/62* (2013.01); *H03F 3/24* (2013.01); *H03H 11/342* (2013.01);
(Continued)

(58) Field of Classification Search
CPC ......... H04B 5/0093; H04B 1/40–1/588; H03F 3/24–3/3098; H03F 3/45–3/45995; H03H 11/342–11/40
See application file for complete search history.

(56) References Cited

U.S. PATENT DOCUMENTS 3,519,765 A * 7/1970 Huber ...................... H03F 3/62
455/16
5,057,791 A * 10/1991 Thompson ............ H03F 3/1935
330/277

(Continued)

OTHER PUBLICATIONS

J. Zhou, N. Reiskarimian and H. Krishnaswamy, "9.8 Re-ceiver with integrated magnetic-free N-path-filter-based non-reciprocal circulator and baseband self-interference cancella-tion for full-duplex wireless," 2016 IEEE International Solid-State Circuits Conference (ISSCC), San Francisco, CA, 2016, pp. 178-180.

(Continued)

*Primary Examiner* — Gennadiy Tsvey
(74) *Attorney, Agent, or Firm* — Hammer & Associates, P.C.

(57) ABSTRACT

A wireless transceiver includes: a switching amplifier having first, second and power ports; and a current provider. The current provider provides a current to the power port, and further provides an impedance to the power port such that an impedance of the switching amplifier at the second port matches an impedance of an antenna coupled to the second port. The switching amplifier simultaneously amplifies a transmit signal input received at the first port to generate an output signal at the second port for receipt by the antenna, and mixes a receive signal received at the second port from the antenna with the transmit signal input to generate, at the power port, another output signal having a frequency lower than that of the receive signal.

12 Claims, 15 Drawing Sheets

(51) Int. Cl.
*H04B 1/52* (2015.01)
*H03F 3/24* (2006.01)
*H03H 11/40* (2006.01)
*H04B 1/44* (2006.01)
*H04B 1/48* (2006.01)

(52) U.S. Cl.
CPC ............. *H03H 11/40* (2013.01); *H04B 1/44* (2013.01); *H04B 1/52* (2013.01); *H04B 2001/485* (2013.01)

(56) References Cited

U.S. PATENT DOCUMENTS

| | | | | |
|---|---|---|---|---|
| 5,305,469 | A * | 4/1994 | Camiade | G06K 19/0723 330/277 |
| 5,590,412 | A * | 12/1996 | Sawai | H03F 3/1935 330/282 |
| 7,831,214 | B1 * | 11/2010 | Stockmann | G01S 7/034 455/78 |
| 7,877,063 | B2 * | 1/2011 | Kim | H03F 3/195 330/296 |
| 8,190,099 | B2 * | 5/2012 | Berg | H03F 1/56 330/277 |
| 8,301,186 | B2 * | 10/2012 | Gorbachov | H04B 1/44 455/127.2 |
| 8,514,035 | B2 | 8/2013 | Mikhemar et al. | |
| 8,989,679 | B2 * | 3/2015 | Cercelaru | H03F 3/195 330/296 |
| 9,490,866 | B2 | 11/2016 | Goel et al. | |
| 9,590,794 | B2 | 3/2017 | Analui et al. | |
| 9,602,155 | B2 * | 3/2017 | Chartier | H01Q 3/28 |
| 9,755,668 | B2 | 9/2017 | Mandegaran et al. | |
| 9,762,416 | B2 | 9/2017 | Mandegaran | |
| 10,211,797 | B2 * | 2/2019 | Roderick | H03F 3/50 |
| 2002/0151281 | A1 * | 10/2002 | Izadpanah | H04B 1/44 455/83 |
| 2002/0164971 | A1 * | 11/2002 | Weinholt | H03D 7/1408 455/323 |
| 2002/0197974 | A1 * | 12/2002 | Weinholt | H03D 7/125 455/313 |
| 2004/0229573 | A1 * | 11/2004 | Krasser | H03F 1/223 455/73 |
| 2010/0027568 | A1 * | 2/2010 | Rajendran | H03K 17/693 370/532 |

OTHER PUBLICATIONS

D. J. van den Broek, E. A. M. Klumperink and B. Nauta, "19.2 A self-interference-cancelling receiver for in-band full-duplex wireless with low distortion under cancellation of strong TX leakage," 2015 IEEE International Solid-State Circuits Conference—(ISSCC) Digest of Technical Papers, San Francisco, CA, 2015, pp. 1-3.

D. Yang, H. Yüksel and A. Molnar, "A Wideband Highly In-tegrated and Widely Tunable Transceiver for In-Band Full-Duplex Communication," Duplex Communication, in IEEE Journal of Solid-State Circuits, vol. 50, No. 5, pp. 1189-1202, May 2015.

B. van Liempd et al., "A +70-dBm IIP3 Electrical-Balance Duplexer for Highly Integrated Tunable Front-Ends," in IEEE Transactions on Microwave Theory and Techniques, vol. 64, No. 12, pp. 4274-4286, Dec. 2016.

* cited by examiner

WIRELESS TRANSCEIVER

CROSS-REFERENCE TO RELATED APPLICATION

This application claims priority of Taiwanese Patent Application No. 107103738, filed on Feb. 2, 2018.

FIELD

The disclosure relates to wireless communication, and more particularly to a full-duplex wireless transceiver.

BACKGROUND

A short distance radar apparatus may transmit and receive signals using a two-antenna scheme or a single-antenna scheme. For a conventional two-antenna short distance radar apparatus, two antennas are respectively used for transmitting and receiving, resulting in a relatively high hardware cost of the conventional two-antenna short distance radar apparatus. For a conventional single-antenna short distance radar apparatus, a single antenna is used for both transmitting and receiving, and a ferrite circulator is generally used for signal separation. The ferrite circulator cannot be fabricated by standard semiconductor process, resulting in a relatively high hardware cost of the conventional single-antenna short distance radar apparatus.

SUMMARY

Therefore, an object of the disclosure is to provide a wireless transceiver that is operatively associated with a single antenna, and that can be used in a short distance radar apparatus to reduce a hardware cost of the same.

According to the disclosure, the wireless transceiver includes a switching amplifier and a current provider. The switching amplifier has a first port, a second port that is used to be coupled to an antenna, and a power port. The current provider is coupled to the power port of the switching amplifier, provides a current to the switching amplifier, and further provides an impedance to the switching amplifier such that an impedance of the switching amplifier at the second port matches an impedance of the antenna. The switching amplifier is for receiving a transmit signal input at the first port thereof, and is further for receiving a receive signal from the antenna at the second port thereof. The switching amplifier simultaneously amplifies the transmit signal input to generate a first output signal at the second port thereof for receipt by the antenna, and mixes the receive signal with the transmit signal input to generate, at the power port thereof, a second output signal having a frequency lower than that of the receive signal.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
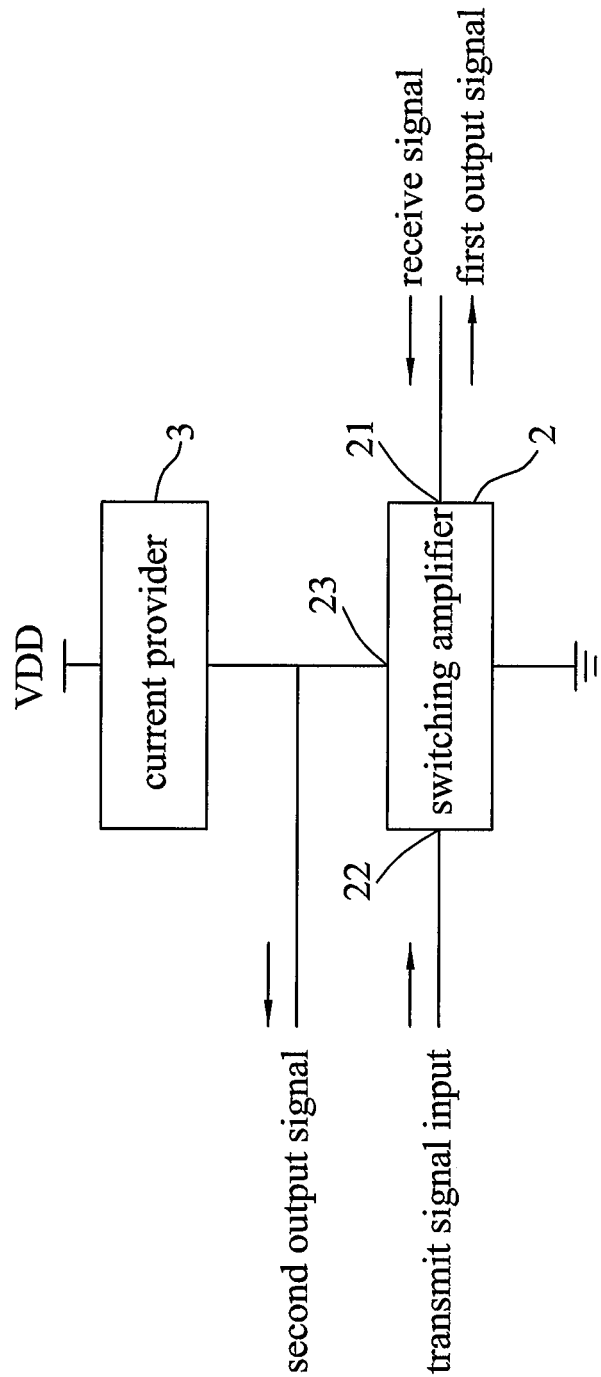
FIG. 1 is a block diagram illustrating a first embodiment of a wireless transceiver according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a wireless transceiver according to the disclosure includes a switching amplifier 2 and a current provider 3. The switching amplifier 2 has a first port 22, a second port 21 that is used to be coupled to an antenna (not shown), and a power port 23. The current provider 3 is coupled to the power port 23 of the switching amplifier 2, provides a current to the switching amplifier 2, and further provides an impedance to the switching amplifier 2 such that an impedance of the switching amplifier 2 at the second port 21 matches an impedance of the antenna. The switching amplifier 2 is for receiving a transmit signal input at the first port 22 thereof, and is further for receiving a receive signal from the antenna at the second port 21 thereof. The switching amplifier 2 simultaneously performs the following: (a) amplifying the transmit signal input to generate a first output signal at the second port 21 thereof for receipt by the antenna; and (b) mixing the receive signal with the transmit signal input to generate, at the power port 23 thereof, a second output signal having a frequency lower than that of the receive signal. In this embodiment, the transmit signal is of radio frequency, and is a frequency modulated continuous wave; the first output signal is transmitted by the antenna, reflected by an object (not shown), and received by the antenna as the receive signal; and the second output signal is of intermediate frequency. However, the disclosure is not limited thereto.

Figure 2:
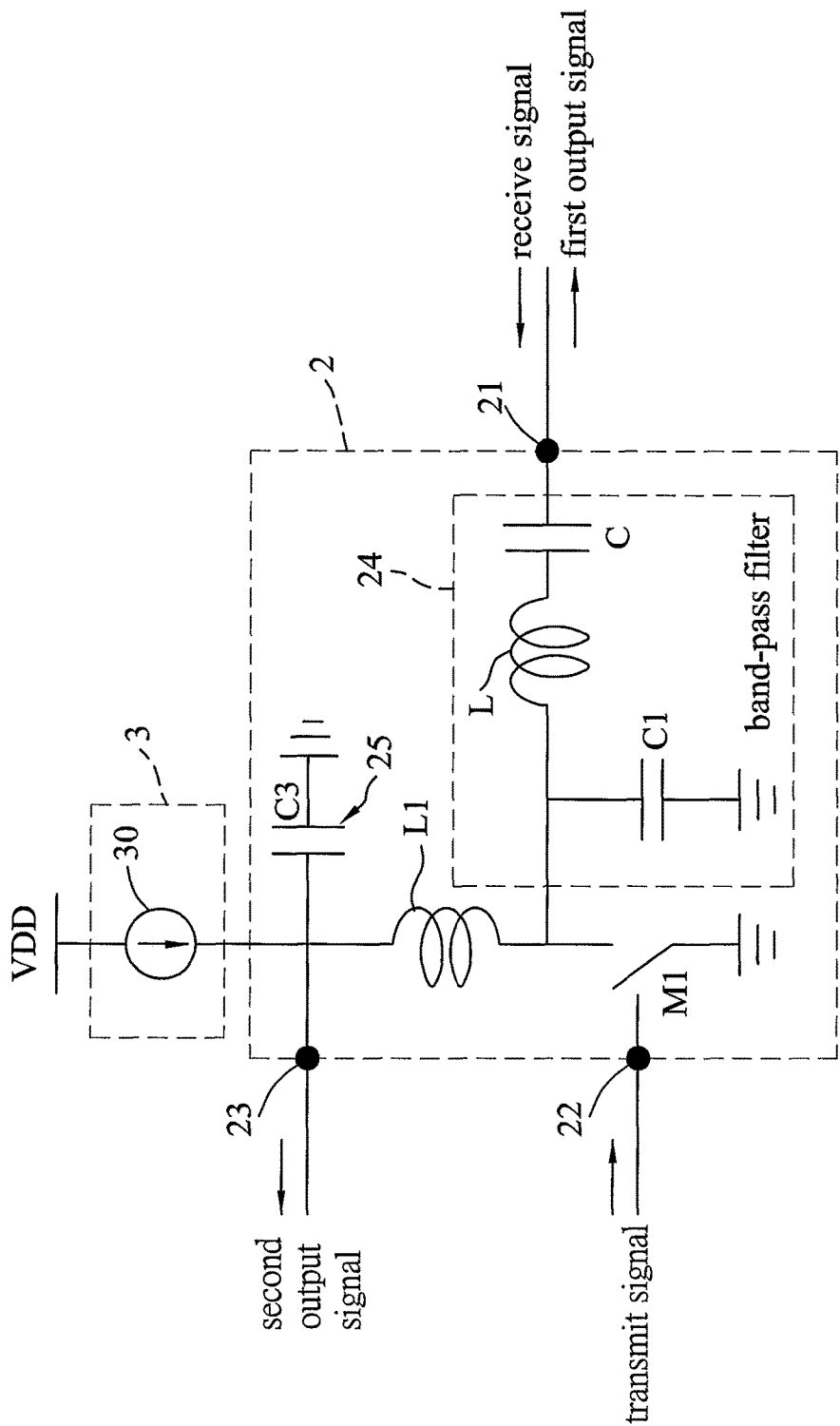
FIG. 2 is a circuit diagram illustrating the first embodiment.

Referring to FIG. 2, in this embodiment, the transmit signal input (see FIG. 1) is single-ended, and includes a transmit signal; and the power amplifier 2 is a class-E amplifier, and includes a switch (M1), an inductor (L1), a band-pass filter 24 and a bypass device 25. The switch (M1) has a first terminal, a second terminal that is grounded, and a control terminal that is coupled to the first port 22 for receiving the transmit signal therefrom. The inductor (L1) is coupled between the power port 23 and the first terminal of the switch (M1). The band-pass filter 24 includes two capacitors (C1, C) and an inductor (L). The capacitor (C1) is coupled between the first terminal of the switch (M1) and ground. The inductor (L) and the capacitor (C) are coupled in series between the first terminal of the switch (M1) and the second port 21, with the inductor (L) coupled to the first terminal of the switch (M1) and the capacitor (C) coupled to the second port 21. The band-pass filter 24 has a passband that covers a frequency of the transmit signal and the frequency of the receive signal, and that does not cover the frequency of the second output signal. The bypass device 25 includes a capacitor (C3) coupled between the power port 23 and ground. The bypass device 25 cooperates with the inductor (L1) to form a low-pass filter having a passband that covers the frequency of the second output signal, and that does not cover the frequency of the transmit signal and the frequency of the receive signal.

Figure 3:
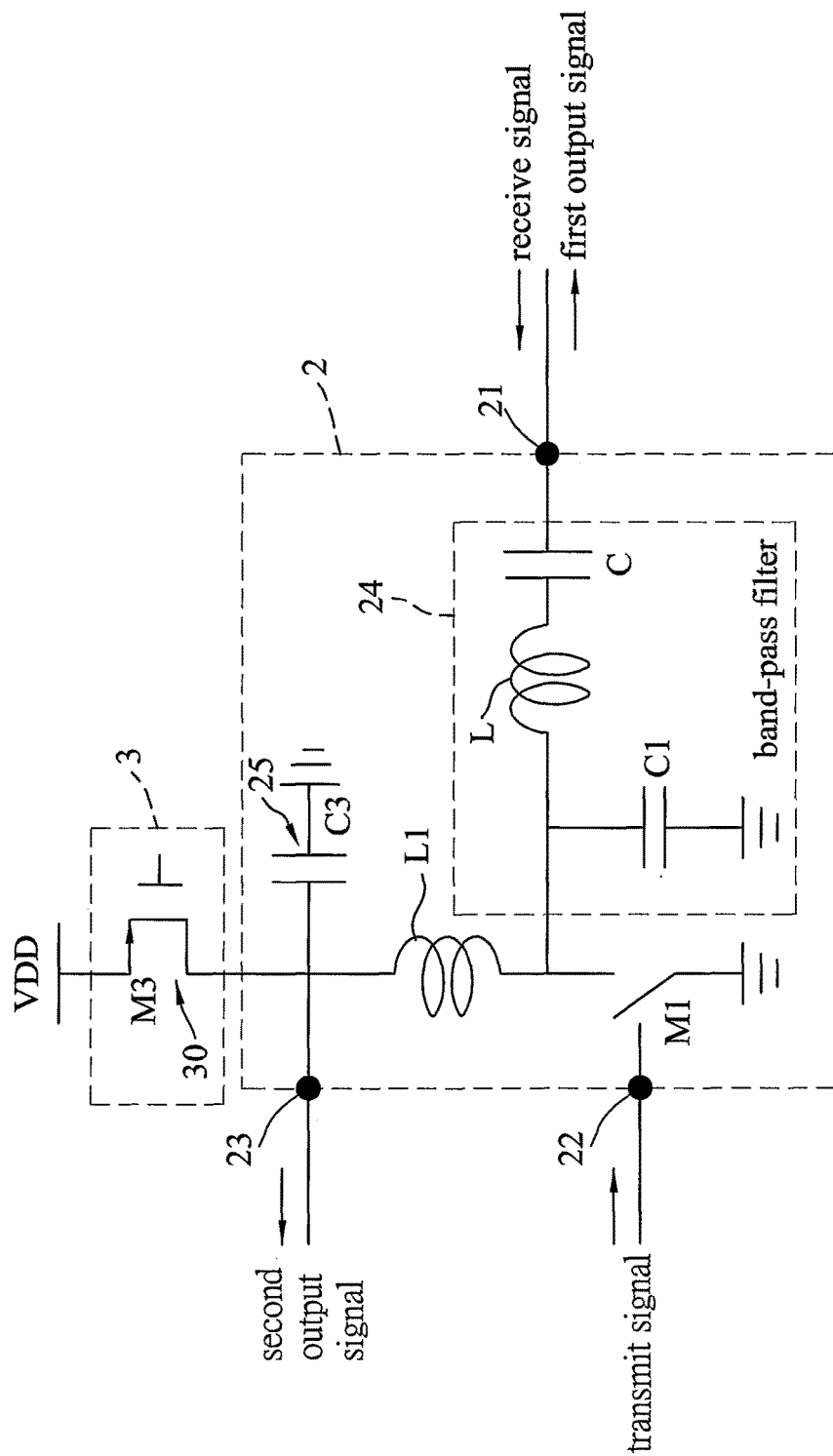
FIG. 3 is a circuit diagram illustrating a current source of the first embodiment.
Figure 4:
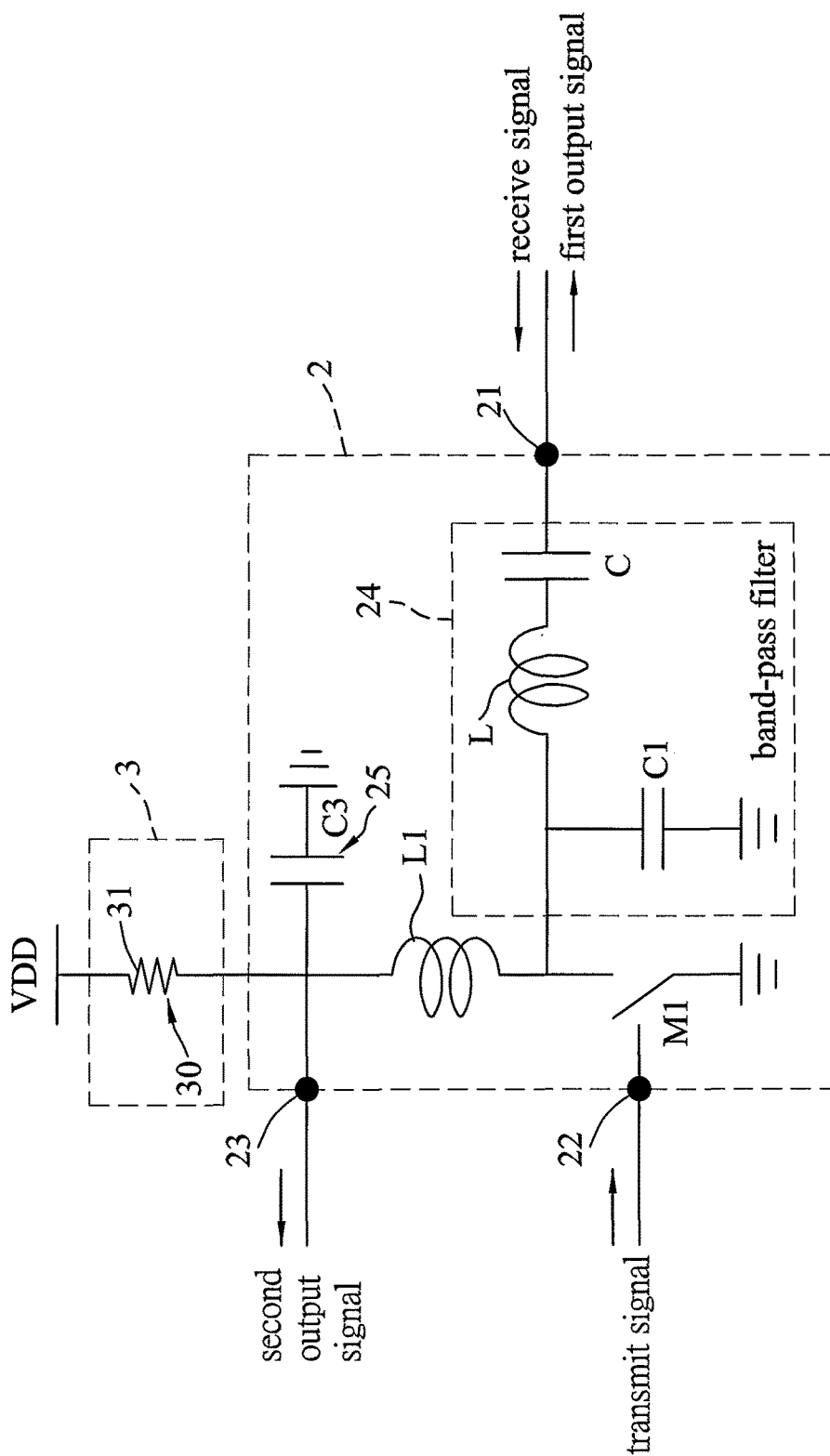
FIG. 4 is a circuit diagram illustrating a modification of the current source of the first embodiment.
Figure 5:
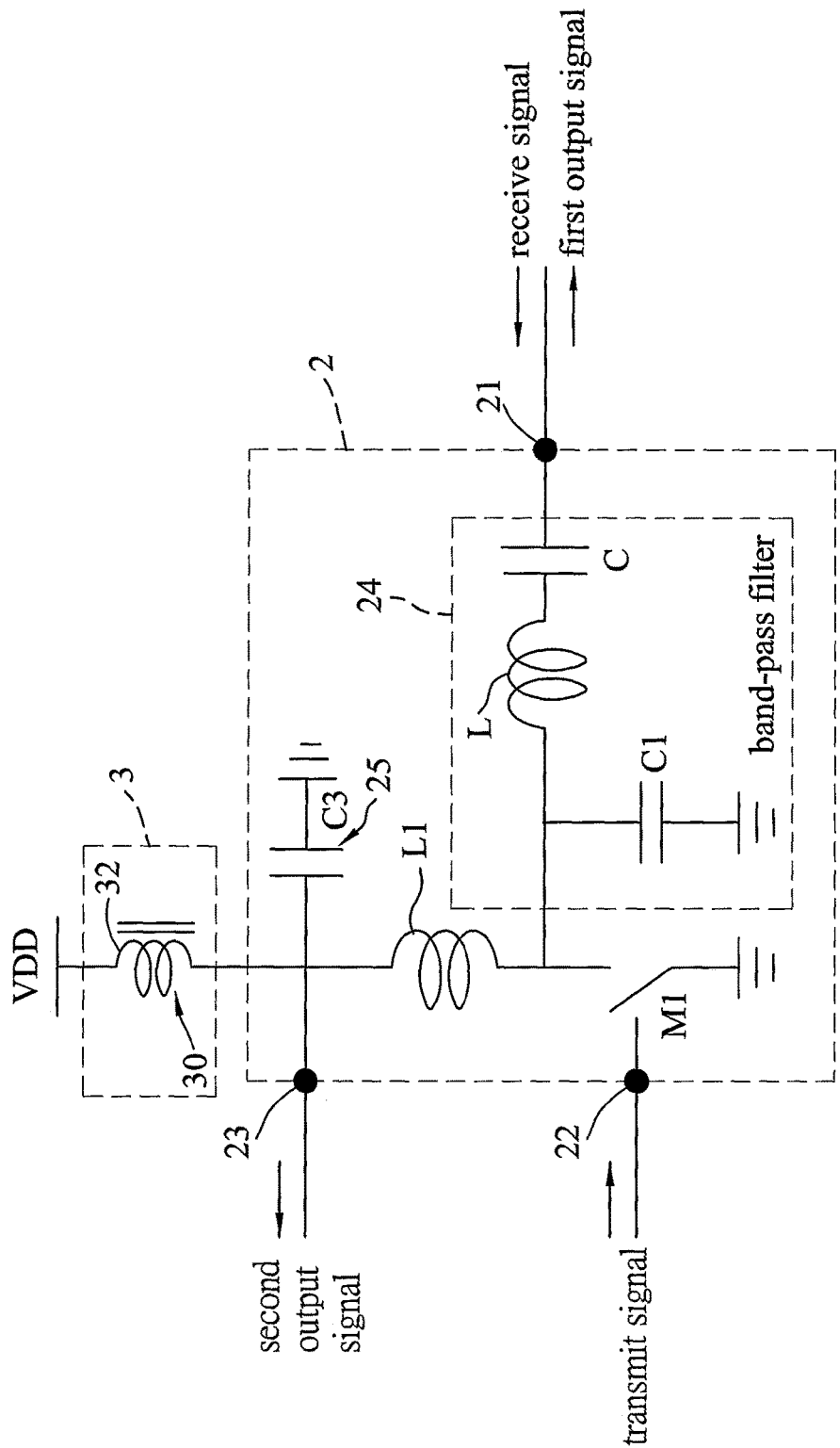
FIG. 5 is a circuit diagram illustrating another modification of the current source of the first embodiment.

In this embodiment, the current provider 3 provides the impedance to the switching amplifier 2 at a relatively low frequency band (ranging from several KHz to several MHz and covering the frequency of the second output signal), such that the impedance of the switching amplifier 2 at the second port 21 matches the impedance of the antenna at a relatively high frequency band covering the frequency of the receive signal. In addition, the impedance provided by the current provider 3 to the switching amplifier 2 is related to a conversion gain of the switching amplifier 2 (i.e., a ratio of a voltage amplitude of the second output signal to a voltage amplitude of the receive signal). Moreover, the current provider 3 includes a current source 30 that is coupled to the power port 23 of the switching amplifier 2, and that provides the current and the impedance to the switching amplifier 2. As shown in FIG. 3, in this embodiment, the current source 30 includes a transistor (M3) (e.g., a P-type metal oxide semiconductor field effect transistor (pMOSFET)) having a first terminal (e.g., a source terminal) that is for receiving a supply voltage (VDD), a second terminal (e.g., a drain terminal) that is coupled to the power port 23 of the switching amplifier 2, and a control terminal (e.g., a gate terminal). As shown in FIG. 4, in another embodiment, the current source 30 may include a resistor 31 having a first terminal that is for receiving the supply voltage (VDD), and a second terminal that is coupled to the power port 23 of the switching amplifier 2. As shown in FIG. 5, in yet another embodiment, the current source 30 may include a choke 32 (e.g., a radio frequency (RF) choke) having a first terminal that is for receiving the supply voltage (VDD), and a second terminal that is coupled to the power port 23 of the switching amplifier 2.

Figure 6:
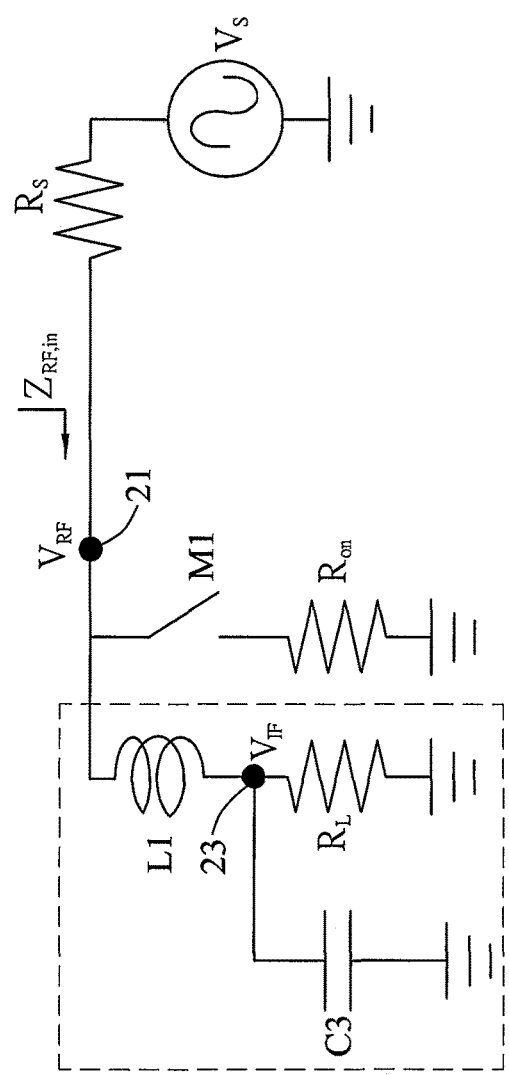
FIG. 6 is an equivalent circuit diagram illustrating the first embodiment providing an impedance ($Z_{RF,in}$) and a conversion gain ($V_{IF}/V_{RF}$)

Referring to FIGS. 3 and 6, an equivalent circuit of the wireless transceiver of this embodiment is depicted in FIG. 6 to illustrate derivation of the impedance ($Z_{RF,in}$) of the switching amplifier 2 at the second port 21 and the conversion gain ($V_{IF}/V_{RF}$) of the switching amplifier 2. It should be noted that the band-pass filter 24 is neglected in FIG. 6.

From FIG. 6, the impedance ($Z_{RF,in}$) can be expressed by the following equation:

$$Z_{RF,in} = \frac{1}{1 - 2 \cdot \frac{R_{on} \cdot (R_S + R_L)}{R_L \cdot (R_S + R_{on})}} \cdot R_S,$$

where $R_S$ denotes the impedance of the antenna, $R_{on}$ denotes an ON impedance of the switch (M1), and $R_L$ denotes the impedance provided by the current provider 3 to the switching amplifier 2. Impedance matching requires a reflection coefficient smaller than 10 dB, and therefore the matching between the impedances ($Z_{RF,in}$, $R_S$) is achieved when the impedance ($Z_{RF,in}$) is greater than $0.52 \times R_S$ and smaller than $1.92 \times R_S$ $$\left(\text{i.e., } R_L > \frac{R_S}{0.24 \cdot \frac{R_S}{R_{on}} - 0.76}\right).$$

The impedance ($R_{on}$) is generally far smaller than the impedance ($R_S$), and therefore the matching between the impedances ($Z_{RF,in}$, $R_S$) is achieved when the impedance ($R_L$) is greater than $4.2 \times R_{on}$.

From FIG. 6, the conversion gain ($V_{IF}/V_{RF}$) of the switching amplifier 2 can be expressed by the following equation:

$$\frac{V_{IF}}{V_{RF}} = \frac{j}{\Pi} \cdot \left(\frac{R_L}{R_S + R_L} - \frac{R_L // R_{on}}{R_S + R_L // R_{on}}\right),$$

where $V_{IF}$ denotes the voltage amplitude of the second output signal, and $V_{RF}$ denotes the voltage amplitude of the receive signal.

Figure 7:
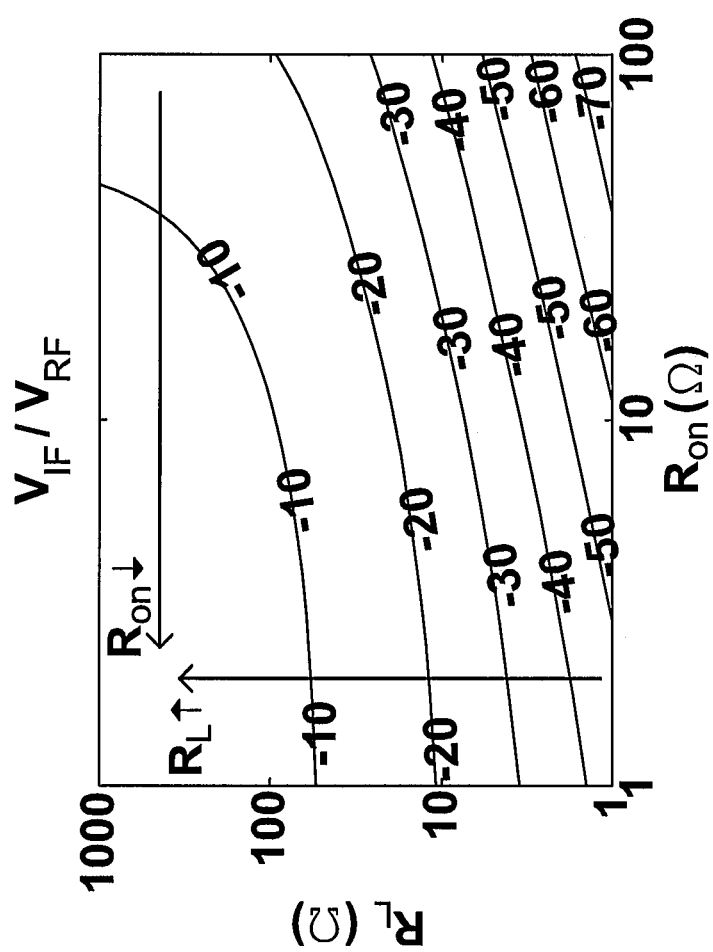
FIG. 7 is a plot illustrating the conversion gain ($V_{IF}/V_{RF}$) with respect to two impedances ($R_L$, $R_{on}$) of the first embodiment.

FIG. 7 illustrates the simulated conversion gain ($V_{IF}/V_{RF}$) with respect to the impedances ($R_L$, $R_{on}$). It is known from FIG. 7 that the conversion gain ($V_{IF}/V_{RF}$) increases with increasing impedance ($R_L$).

Figure 8:
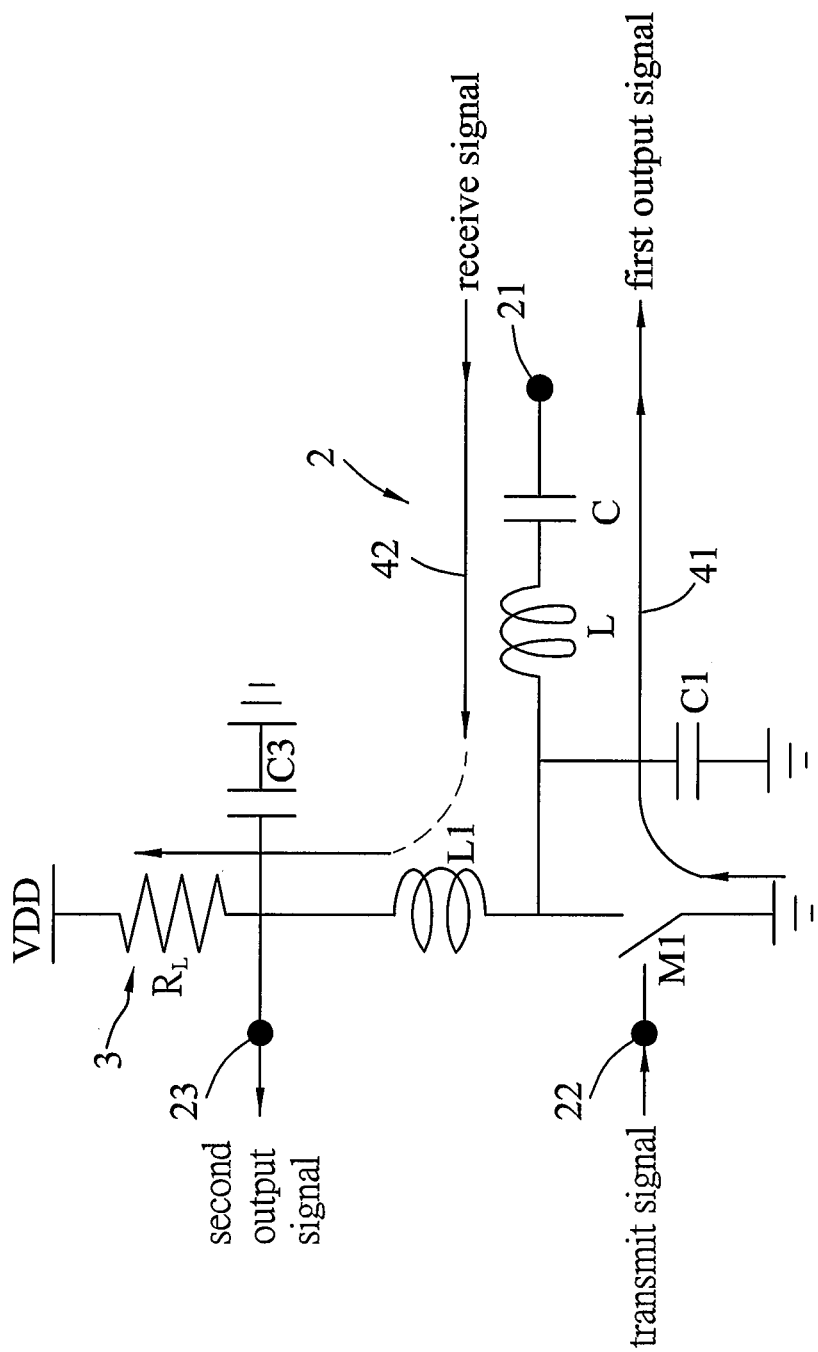
FIG. 8 is an equivalent circuit diagram illustrating the first embodiment providing a transmit path and a receive path.

Referring to FIG. 8, by virtue of the current provider 3 which not only provides the current to the power port 23 of the switching amplifier 2, but also provides the impedance ($R_L$) to the power port 23 of the switching amplifier 2 such that the impedance of the switching amplifier 2 at the second port 21 matches the impedance of the antenna, the wireless transceiver of this embodiment can simultaneously provide a transmit path 41 and a receive path 42. The transmit signal received at the first port 22 of the switching amplifier 2 is amplified in the transmit path 41 to generate the first output signal at the second port 21 of the switching amplifier 2. The receive signal received at the second port 21 of the switching amplifier 2 is mixed with the transmit signal in the receive path 42 to generate the second output signal at the power port 23 of the switching amplifier 2. Therefore, the wireless transceiver of this embodiment is a so-called full-duplex wireless transceiver, and the three-port switching amplifier 2 can perform signal separation as does a circulator.

Figure 9:
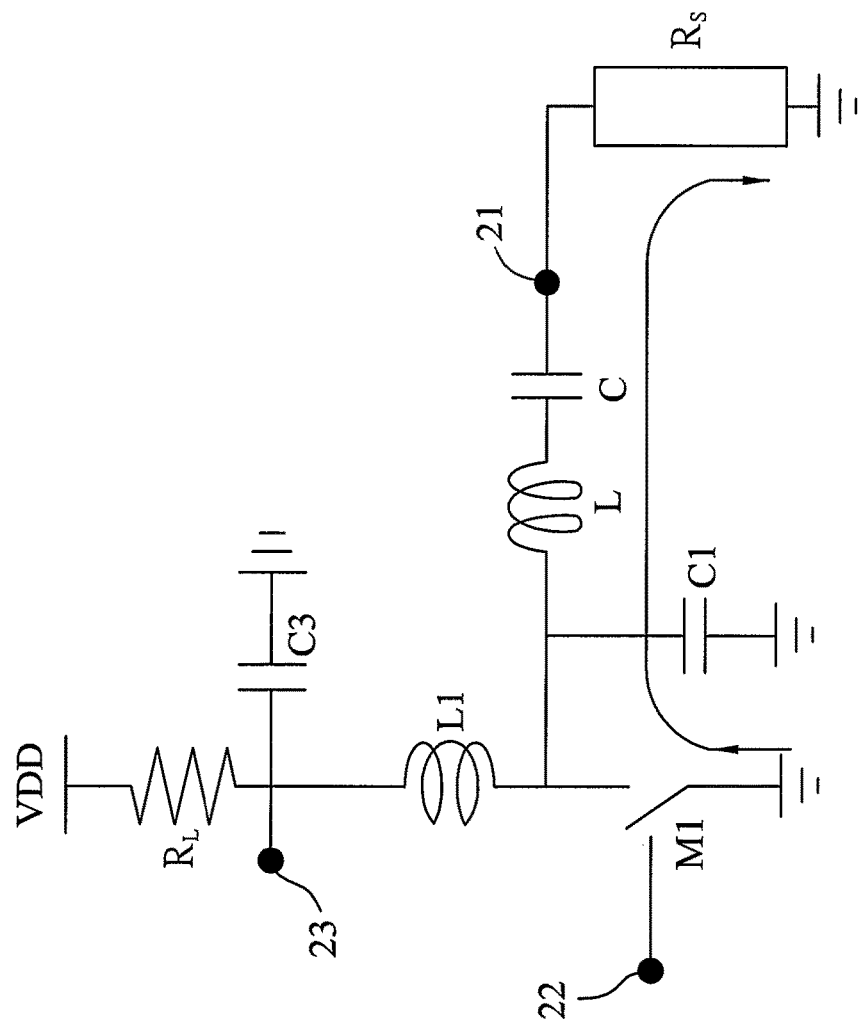
FIG. 9 is an equivalent circuit diagram illustrating the first embodiment amplifying a transmit signal to generate a first output signal.

FIG. 9 depicts an equivalent circuit of the wireless transceiver of this embodiment, illustrating the amplifying operation. The switch (M1) alternates between conduction and non-conduction based on the transmit signal (see FIG. 3) received at the first port 22. The inductor (L1) provides a direct current (DC) feed. The capacitor (C3) provides an alternating current (AC) ground. The inductor (L) and the capacitor (C) cooperatively provide harmonic suppression.

Figure 10:
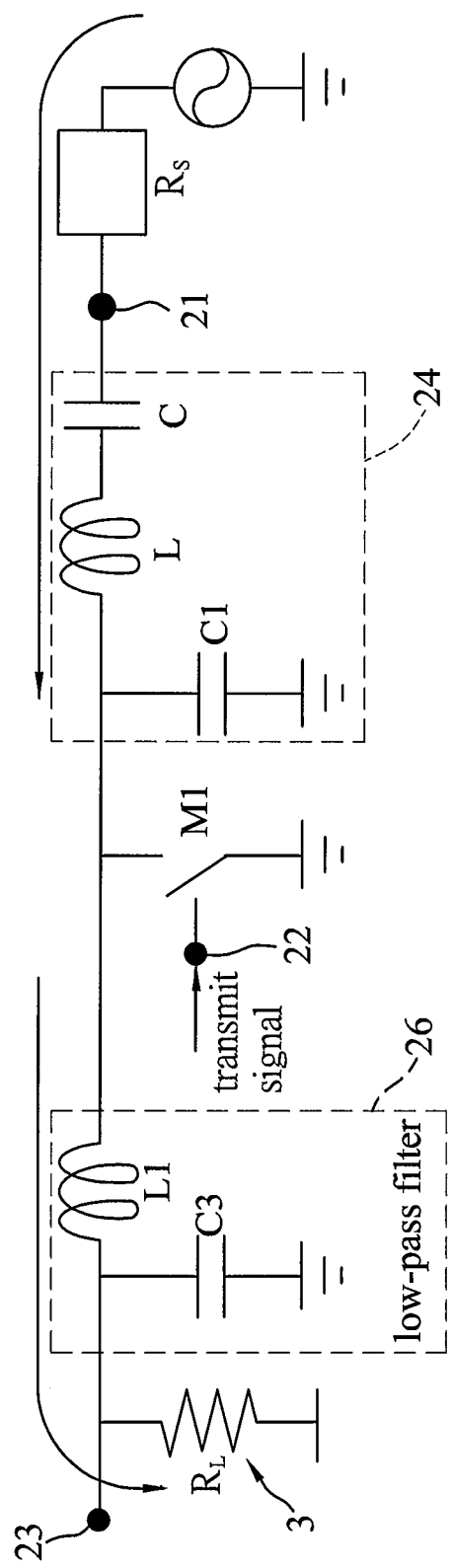
FIG. 10 is an equivalent circuit diagram illustrating the first embodiment mixing a receive signal with the transmit signal to generate a second output signal.

FIG. 10 depicts an equivalent circuit of the wireless transceiver of this embodiment, illustrating the mixing operation. The band-pass filter 24 and the low-pass filter 26 formed by the inductor (L1) and the capacitor (C3) restrict respective flows of the receive signal (see FIG. 3) and the second output signal (see FIG. 3). In addition, the first and second output signals (see FIG. 3) are separated in different frequency bands, and therefore the first port 22 and the power port 23 are isolated from interfering with each other.

Figure 11:
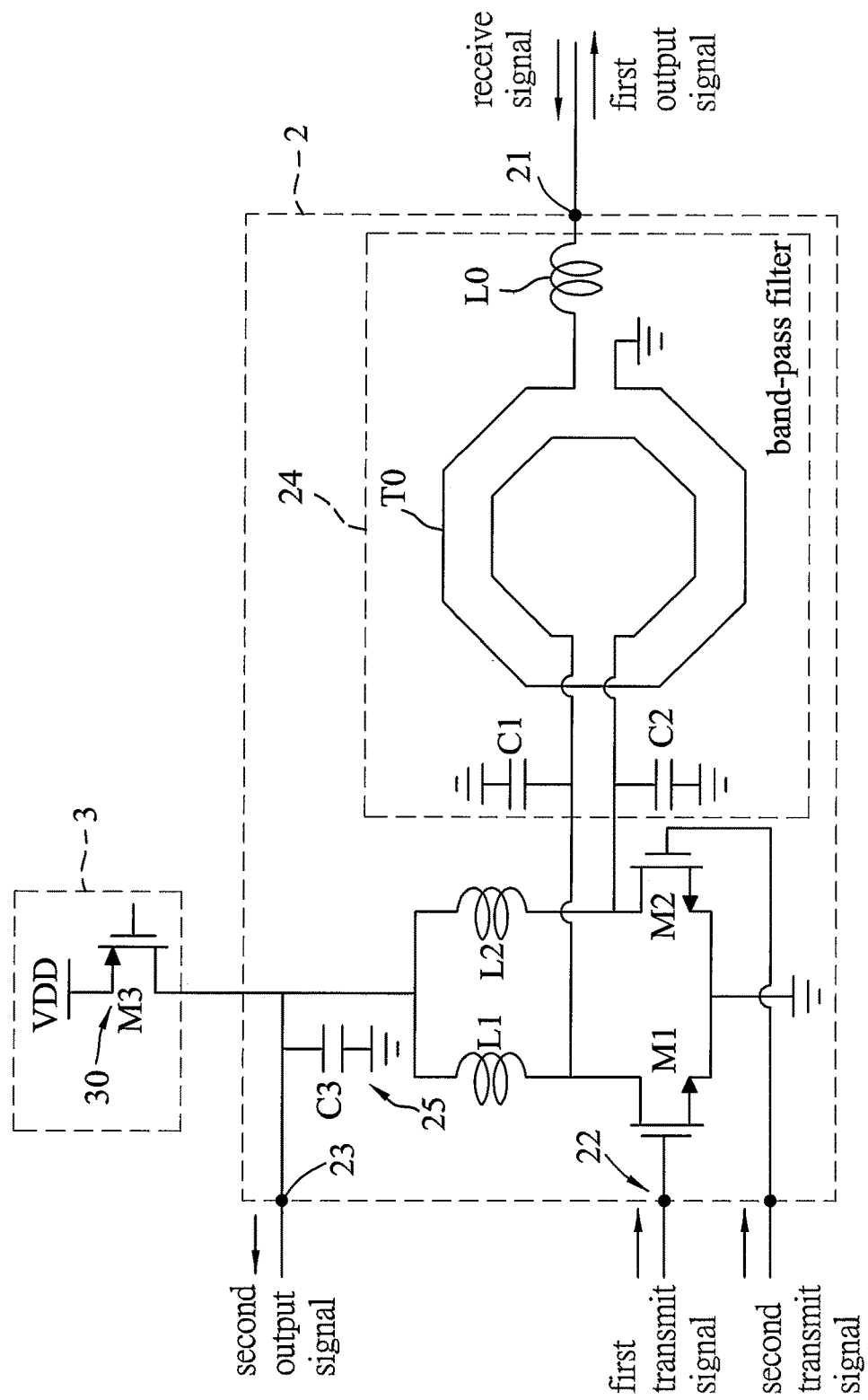
FIG. 11 is a circuit diagram illustrating a second embodiment of the wireless transceiver according to the disclosure.

Referring to FIG. 11, a second embodiment of the wireless transceiver according to the disclosure is a modification of the first embodiment, and differs from the first embodiment in that the transmit signal input is differential and in the configuration of the switching amplifier 2.

In the second embodiment, the transmit signal input includes a first transmit signal and a second transmit signal, and the switching amplifier 2 includes two switches (M1, M2), two inductors (L1, L2), a band-pass filter 24 and a bypass device 25. The switch (M1) has a first terminal, a second terminal that is grounded, and a control terminal that is coupled to the first port 22 for receiving the first transmit signal therefrom. The switch (M2) has a first terminal, a second terminal that is grounded, and a control terminal that is coupled to the first port 22 for receiving the second transmit signal therefrom. The inductor (L1) is coupled between the power port 23 and the first terminal of the switch (M1). The inductor (L2) is coupled between the power port 23 and the first terminal of the switch (M2). The band-pass filter 24 includes two capacitors (C1, C2), a balun (T0) and an inductor (L0). The capacitor (C1) is coupled between the first terminal of the switch (M1) and ground. The capacitor (C2) is coupled between the first terminal of the switch (M2) and ground. The balun (T0) has a balanced side that is coupled to the first terminals of the switches (M1, M2), and an unbalanced side. The inductor (L0) is coupled between the unbalanced side of the balun (T0) and the second port 21. The band-pass filter 24 has a passband that covers a frequency of each of the first and second transmit signals and the frequency of the receive signal, and that does not cover the frequency of the second output signal. The bypass device 25 includes a capacitor (C3) coupled between the power port 23 and ground, and cooperates with the inductors (L1, L2) to form a low-pass filter having a passband that covers the frequency of the second output signal, and that does not cover the frequency of each of the first and second transmit signals and the frequency of the receive signal.

It should be noted that in other embodiments, the transistor (M3) may be replaced by a resistor or a choke (e.g., an RF choke).

In transmit operation of the wireless transceiver of this embodiment, each of the switches (M1, M2) alternates between conduction and non-conduction based on the corresponding one of the first and second transmit signals to convert DC power from the current provider 3 into AC power of radio frequency. In receive operation of the wireless transceiver of this embodiment, the receive signal is converted into a differential signal pair by the balun (T0), and the differential signal pair is down-converted by the switches (M1, M2), filtered by the low-pass filter (formed by the inductors (L1, L2) and the capacitor (C3)), and combined at the power port 23. It should be noted that the impedance ($R_L$) (see FIG. 12) provided by the current provider 3 to the switching amplifier 2 can be designed in a way similar to that of the first embodiment, and details thereof are omitted herein for the sake of brevity.

Figure 12:
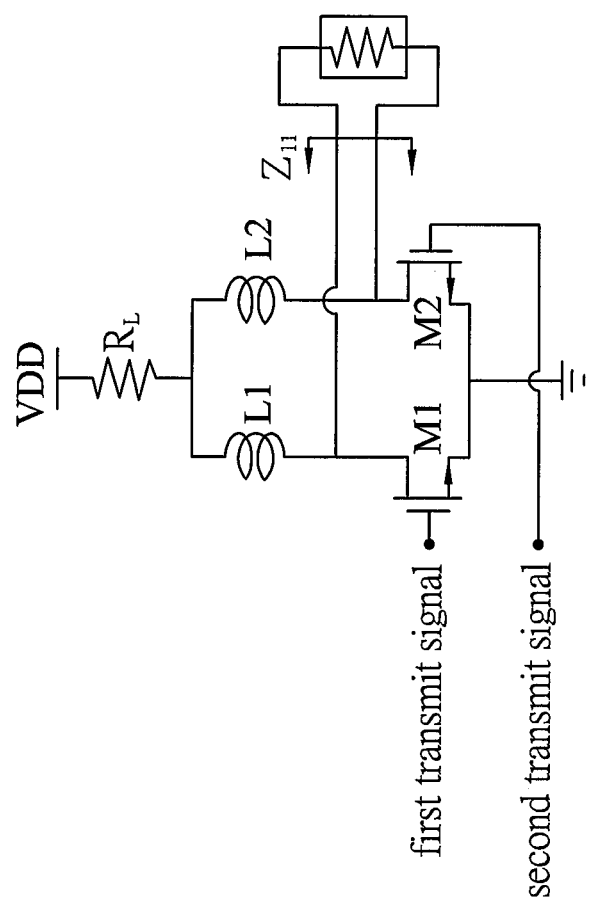
FIG. 12 is an equivalent circuit diagram illustrating the second embodiment providing an impedance ($Z_{11}$)
Figure 13:
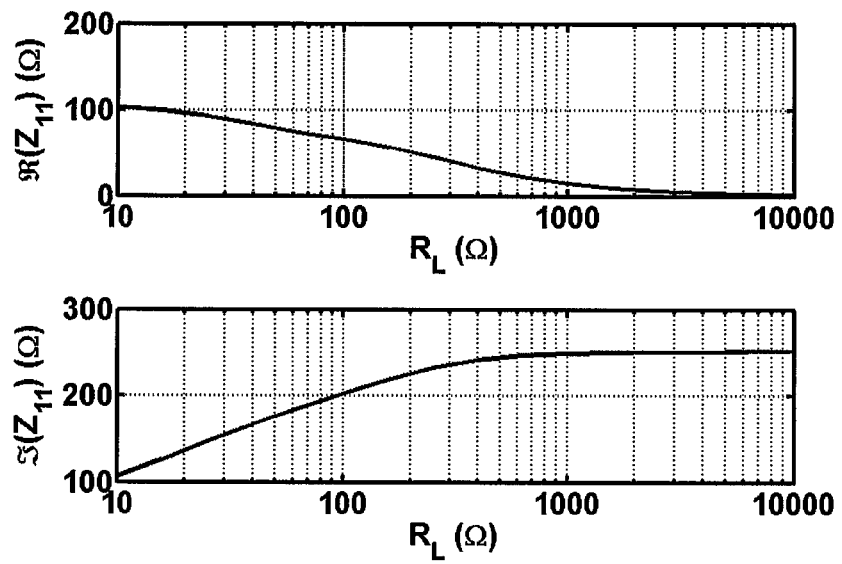
FIG. 13 is a plot illustrating a real part and an imaginary part of the impedance ($Z_{ii}$) with respect to an impedance ($R_L$) of the second embodiment.
Figure 14:
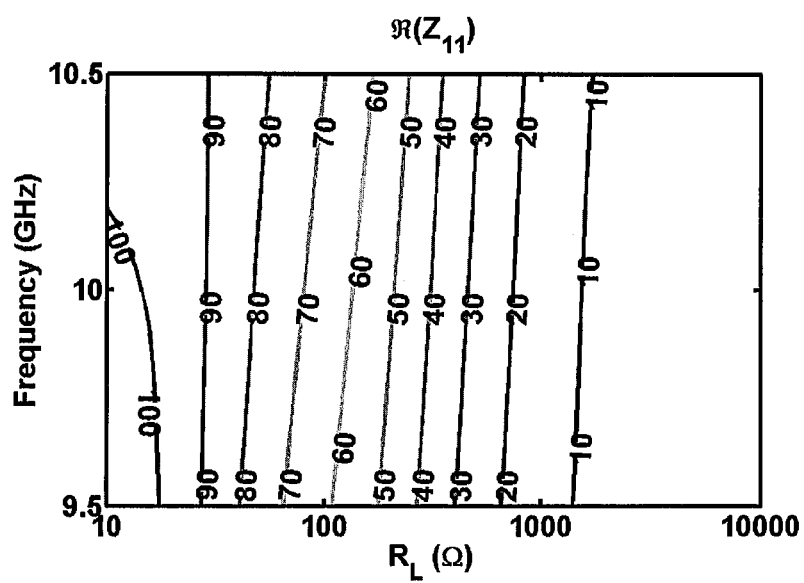
FIG. 14 is a plot illustrating the real part of the impedance ($Z_{11}$) with respect to a frequency and the impedance ($R_L$) of the second embodiment.
Figure 15:
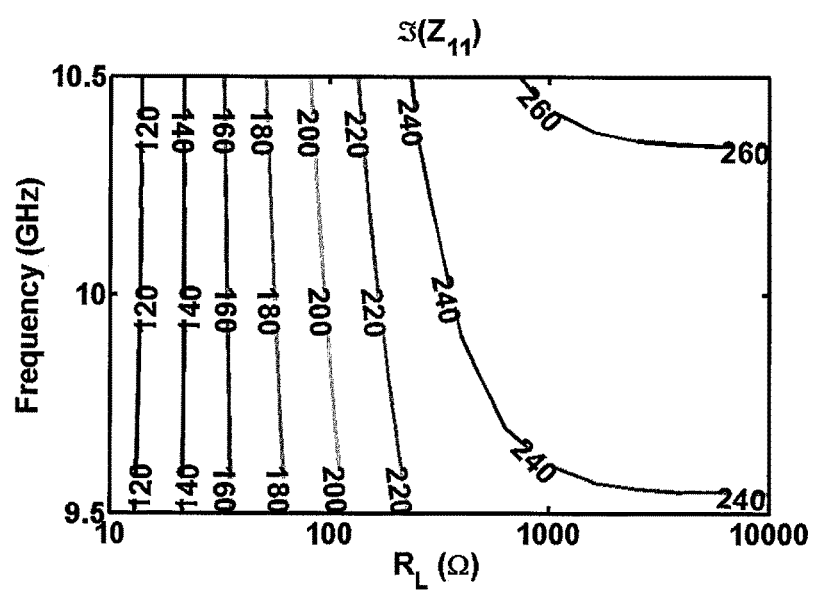
FIG. 15 is a plot illustrating the imaginary part of the impedance ($Z_{11}$) with respect to the frequency and the impedance ($R_L$) of the second embodiment.

FIG. 12 depicts an equivalent circuit of the wireless transceiver of this embodiment, illustrating the impedance ($Z_{11}$) of the switching amplifier 2 (see FIG. 11) at the second port 21 (see FIG. 11). It should be noted that, in FIG. 12, the band-pass filter 24 (see FIG. 11) is neglected. FIG. 13 illustrates the simulated impedance ($Z_{11}$) with respect to the impedance ($R_L$) in a scenario where a frequency of each of the first and second transmit signals (see FIG. 11) is 10 GHz, where an inductance of each of the inductors (L1, L2) (see FIG. 11) is 2 nH, and where an ON impedance of each of the switches (M1, M2) (see FIG. 11) is 5Ω. FIGS. 14 and 15 illustrate the simulated impedance ($Z_{11}$) with respect to the frequency of each of the first and second transmit signals (see FIG. 11) and to the impedance ($R_L$) in a scenario where the inductance of each of the inductors (L1, L2) (see FIG. 11) is 2 nH, and where the ON impedance of each of the switches (M1, M2) (see FIG. 11) is 5Ω. It is known from FIGS. 13-15 that the impedance ($Z_n$) varies with the impedance ($R_L$).

Figure 16:
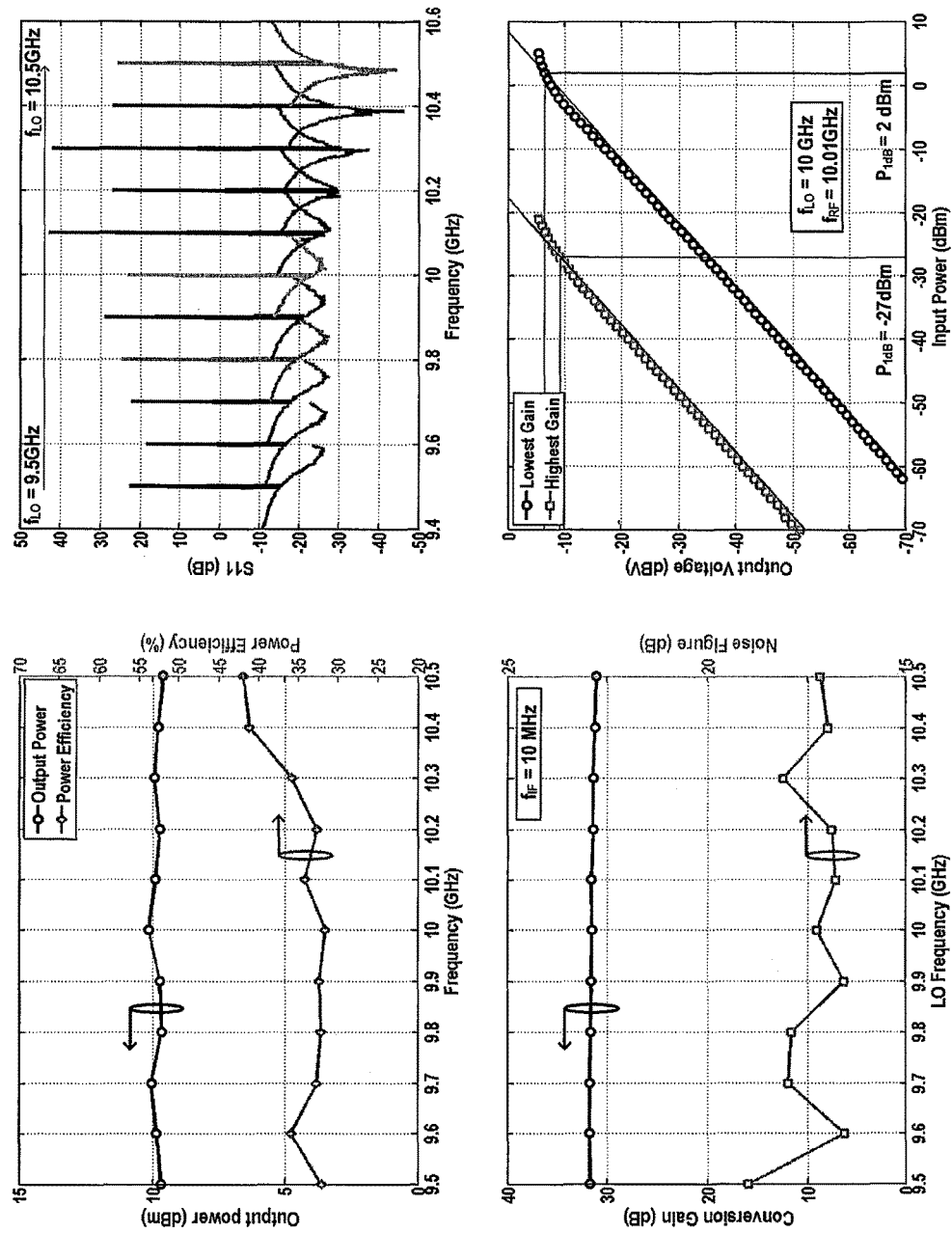
FIG. 16 is a plot illustrating various performances of the second embodiment.

FIG. 16 illustrates various measurement results of the wireless transceiver of this embodiment. It is known from FIG. 16 that: (a) output power is 10.5 dBm and power efficiency is 32% when the frequency of each of the first and second transmit signals (see FIG. 11) is 10 GHz; (b) return loss is better than 10 dB over a range of the frequency of each of the first and second transmit signals (see FIG. 11), ranging from 9.5 GHz to 10.5 GHz; (c) the conversion gain is 32 dB and 1 dB input compression points respectively in a lowest gain scenario and in a highest gain scenario are respectively 2 dBm and −27 dBm when the frequency of each of the first and second transmit signals (see FIG. 11) is 10 GHz and the frequency of the receive signal (see FIG. 11) is 10.01 GHz; and (d) a noise figure is 16.5 dB when the frequency of each of the first and second transmit signals (see FIG. 11) is 9.9 GHz in the highest gain scenario.

In view of the above, for each of the aforesaid embodiments, since the wireless transceiver is operatively associated with a single antenna, and since no element (e.g., a ferrite circulator) is required to be coupled between the wireless transceiver and the antenna for signal separation, a short distance radar apparatus with the wireless transceiver and the antenna can have a relatively low hardware cost.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, Figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A wireless transceiver comprising:
a switching amplifier having a first port, a second port that is used to be coupled to an antenna, and a power port; and
a current provider coupled to said power port of said switching amplifier, providing a current to said switching amplifier, and further providing an impedance to said switching amplifier such that an impedance of said switching amplifier at said second port matches an impedance of the antenna;
said switching amplifier being for receiving a transmit signal input at the first port thereof, and being further for receiving a receive signal from the antenna at the second port thereof;
said switching amplifier simultaneously
amplifying the transmit signal input to generate a first output signal at said second port thereof for receipt by the antenna, and
mixing the receive signal with the transmit signal input to generate, at said power port thereof, a second output signal having a frequency lower than that of the receive signal.

2. The wireless transceiver of claim 1, wherein said switching amplifier is a class-E amplifier.

3. The wireless transceiver of claim 2, the transmit signal input being differential, and including a first transmit signal and a second transmit signal, wherein said switching amplifier includes:
a first switch having a first terminal, a second terminal that is grounded, and a control terminal that is coupled to said first port for receiving the first transmit signal therefrom;
a second switch having a first terminal, a second terminal that is grounded, and a control terminal that is coupled to said first port for receiving the second transmit signal therefrom;
a first inductor coupled between said power port and said first terminal of said first switch;
a second inductor coupled between said power port and said first terminal of said second switch;
a band-pass filter coupled among said first terminals of said first and second switches and said second port, and having a passband that covers a frequency of each of the first and second transmit signals and the frequency of the receive signal, and that does not cover the frequency of the second output signal; and
a bypass device coupled to said power port, and cooperating with said first and second inductors to form a low-pass filter having a passband that covers the frequency of the second output signal, and that does not cover the frequency of each of the first and second transmit signals and the frequency of the receive signal.

4. The wireless transceiver of claim 3, wherein said band-pass filter includes:
a first capacitor coupled between said first terminal of said first switch and ground;
a second capacitor coupled between said first terminal of said second switch and ground;
a balun having a balanced side that is coupled to said first terminals of said first and second switches, and an unbalanced side; and
a third inductor coupled between said unbalanced side of said balun and said second port.

5. The wireless transceiver of claim 3, wherein said bypass device includes a capacitor coupled between said power port and ground.

6. The wireless transceiver of claim 2, the transmit signal input being single-ended and including a transmit signal, wherein said switching amplifier includes:
a switch having a first terminal, a second terminal that is grounded, and a control terminal that is coupled to said first port for receiving the transmit signal therefrom;
a first inductor coupled between said power port and said first terminal of said switch;
a band-pass filter coupled between said first terminal of said switch and said second port, and having a passband that covers a frequency of the transmit signal and the frequency of the receive signal, and that does not cover the frequency of the second output signal; and
a bypass device coupled to said power port, and cooperating with said first inductor to form a low-pass filter having a passband that covers the frequency of the second output signal, and that does not cover the frequency of the transmit signal and the frequency of the receive signal.

7. The wireless transceiver of claim 6, wherein said band-pass filter includes:
a first capacitor coupled between said first terminal of said switch and ground; and
a second inductor and a second capacitor coupled in series between said first terminal of said switch and said second port.

8. The wireless transceiver of claim 1, wherein said current provider includes a current source that is coupled to said power port of said switching amplifier, and that provides the current and the impedance to said switching amplifier.

9. The wireless transceiver of claim 8, wherein said current source includes a resistor having a first terminal that is for receiving a supply voltage, and a second terminal that is coupled to said power port of said switching amplifier.

10. The wireless transceiver of claim 8, wherein said current source includes a transistor having a first terminal that is for receiving a supply voltage, a second terminal that is coupled to said power port of said switching amplifier, and a control terminal.

11. The wireless transceiver of claim 10, wherein said transistor is a P-type metal oxide semiconductor field effect transistor having a source terminal, a drain terminal and a gate terminal that respectively serve as said first, second and control terminals of said transistor.

12. The wireless transceiver of claim 8, wherein said current source includes a choke having a first terminal that is for receiving a supply voltage, and a second terminal that is coupled to said power port of said switching amplifier.

* * * * *